United States Patent
Huang et al.

(10) Patent No.: US 12,507,552 B2
(45) Date of Patent: Dec. 23, 2025

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yao Huang, Beijing (CN); Yuanyou Qiu, Beijing (CN); Zhi Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/633,563

(22) Filed: Apr. 12, 2024

(65) Prior Publication Data

US 2024/0257754 A1     Aug. 1, 2024

Related U.S. Application Data

(63) Continuation of application No. 17/771,073, filed as application No. PCT/CN2021/076832 on Feb. 19, 2021, now Pat. No. 12,020,642.

(51) Int. Cl.
*H10K 59/131*     (2023.01)
*G09G 3/3233*     (2016.01)
*H10K 59/65*     (2023.01)

(52) U.S. Cl.
CPC ......... *H10K 59/131* (2023.02); *G09G 3/3233* (2013.01); *H10K 59/65* (2023.02)

(58) Field of Classification Search
CPC .... H10K 59/131; H10K 59/65; H10K 59/121; G09G 3/3233; G09G 2300/0426;
(Continued)

(56) References Cited

U.S. PATENT DOCUMENTS

| | | |
|---|---|---|
| 10,962,851 B1 | 3/2021 | Ouyang et al. |
| 2021/0125546 A1 | 4/2021 | Fei et al. |

(Continued)

FOREIGN PATENT DOCUMENTS

| | | |
|---|---|---|
| CN | 109541867 A | 3/2019 |
| CN | 110610667 A | 12/2019 |

(Continued)

OTHER PUBLICATIONS

Written Opinion from PCT/CN2021/076832 dated Nov. 3, 2021.
(Continued)

*Primary Examiner* — Patrick N Edouard
*Assistant Examiner* — Joseph P Fox
(74) *Attorney, Agent, or Firm* — Calfee, Halter & Griswold LLP

(57) ABSTRACT

This disclosure provides a display panel and a display device. The display panel includes a light-transmitting area, a first transitional display area, a first main display area and a second main display area, and further includes a first light-emitting unit in the light-transmitting area, a first pixel driving circuit in the first transitional display area for providing a driving current to the first light-emitting unit, a first signal line extending along the column direction in the first main display area, a second signal line extending along the column direction in the second main display area, and a third signal line. The third signal line and the first signal line are in different conductive layers, the third signal line and the second signal line are in different conductive layers, and the third signal line is connected with the first signal line and the second signal line through via holes respectively.

15 Claims, 11 Drawing Sheets

(58) Field of Classification Search
CPC ... G09G 2300/0819; G09G 2300/0842; G09G 2300/0861; G09G 2320/0233
See application file for complete search history.

(56) References Cited

U.S. PATENT DOCUMENTS

| | | |
|---|---|---|
| 2022/0199710 A1 | 6/2022 | Xu et al. |
| 2023/0026822 A1 | 1/2023 | Wang et al. |
| 2023/0165081 A1 | 5/2023 | Wang et al. |

FOREIGN PATENT DOCUMENTS

| | | |
|---|---|---|
| CN | 110850652 A | 2/2020 |
| CN | 210182387 U | 3/2020 |
| CN | 111370441 A | 7/2020 |
| CN | 111402743 A | 7/2020 |
| CN | 111429838 A | 7/2020 |
| CN | 111446282 A | 7/2020 |
| CN | 210926018 U | 7/2020 |
| CN | 111508377 A | 8/2020 |
| CN | 111599852 A | 8/2020 |
| CN | 111969019 A | 11/2020 |
| CN | 112117320 A | 12/2020 |
| CN | 112186021 A | 1/2021 |
| CN | 112271203 A | 1/2021 |
| KR | 20140086708 A | 7/2014 |
| KR | 102027289 B1 | 10/2019 |

OTHER PUBLICATIONS

International Search Report from PCT/CN2021/076832 dated Nov. 3, 2021.
Notice of Allowance from U.S. Appl. No. 17/771,073 dated Feb. 16, 2024.
Office action from U.S. Appl. No. 17/771,073 dated Nov. 28, 2023.
Office action from European Application No. 21926105.4 dated Sep. 1, 2023.
First Office Action of EP application No. 21926105.4 dated Oct. 7, 2025.

1

DISPLAY PANEL AND DISPLAY DEVICE

CROSS REFERENCE

The present application is a continuation application of U.S. patent application Ser. No. 17/771,073, which is based upon International Application No. PCT/CN2021/076832, filed on Feb. 19, 2021, and the entire contents thereof are incorporated herein by reference.

TECHNICAL FIELD

The present disclosure relates to the technical field of display, in particular to a display panel and a display device.

BACKGROUND

In an under-screen camera technology, a light-transmitting area is provided on a display panel, and a camera is provided directly facing the light-transmitting area, so as to realize a full-screen display. In the related art, in order to improve light transmittance of the light-transmitting area, only light-emitting units are usually arranged in the light-transmitting area, transitional display areas are provided on both sides of the light-transmitting area in a row direction, and pixel driving circuits for driving the light-emitting unit are arranged in the transitional display areas. Data lines located in the same sub-pixel column as the light-emitting units in the light-transmitting area need to be connected to the pixel driving circuits located in the transitional display area in a manner of winding. However, when the light-transmitting area is surrounded by a main display area, the main display area is also provided at both sides of the transitional display area in a column direction, and the data lines located in the main display area at a side of the transitional display area need to penetrate through the transitional display area to extend to the main display area at the other side of the transitional display area. However, the data lines penetrating through the transitional display area are prone to crosstalk with the data lines connected to the transitional display area in the manner of winding.

It should be noted that information disclosed in this part are provided only for acquiring a better understanding of the background of the present application and therefore may include information that is not current technology already known to those of ordinary skill in the art.

SUMMARY

According to one aspect of the present disclosure, a display panel is provided. The display panel includes a light-transmitting area, a first transitional display area, a first main display area and a second main display area. The first transitional display area is located at both sides of the light-transmitting area in the row direction. The first main display area is located at a side of the light-transmitting area and the first transitional display area in the column direction. The second main display area is located at the other side of the light-transmitting area and the first transitional display area in the column direction. The display panel further includes a first light-emitting unit, a first pixel driving circuit, a first signal line, a second signal line and a third signal line. The first light-emitting unit is located in the light-transmitting area. The first pixel driving circuit is located in the first transitional display area for providing a driving current to the first light-emitting unit. The first signal line extends along the column direction, and is at least partially located in the first main display area, for providing a driving signal to a pixel driving circuit located in the same sub-pixel column as the first pixel driving circuit. The second signal line extends along the column direction, and is at least partially located in the second main display area, for providing a driving signal to the pixel driving circuit located in the same sub-pixel column as the first pixel driving circuit. The third signal line and the first signal line are located in different conductive layers, the third signal line and the second signal line are located in different conductive layers, and the third signal line is connected with the first signal line and the second signal line through via holes respectively.

In an exemplary embodiment of the present disclosure, the display panel further includes a first wiring area. The first wiring area is located at a side of the first transitional display area away from the light-transmitting area. The first main display area is also located at a side of the first wiring area in the column direction, and the second main display area is also located at the other side of the first wiring area in the column direction. The third signal line is at least partially located in the first wiring area.

In an exemplary embodiment of the present disclosure, the display panel further includes a second light-emitting unit, a second pixel driving circuit, a fourth signal line, a fifth signal line and a sixth signal line. The second light-emitting unit is located in the first wiring area. The second pixel driving circuit is located in the first transitional display area for providing a driving current to the second light-emitting unit. The fourth signal line extends along the column direction, and is at least partially located in the first main display area, for providing a driving signal to a pixel driving circuit located in the same sub-pixel column as the second pixel driving circuit. The fifth signal line extends along the column direction, and is at least partially located in the second main display area, for providing a driving signal to the pixel driving circuit located in the same sub-pixel column as the second pixel driving circuit. The sixth signal line is located in the first wiring area, and is connected with the fourth signal line and the fifth signal line through via holes respectively.

In an exemplary embodiment of the present disclosure, the display panel further includes a third sub-pixel located in the first transitional display area, and the third sub-pixel includes a third light-emitting unit and a third pixel driving circuit for providing a driving current to the third light-emitting unit. The third sub-pixel, the first pixel driving circuit and the second pixel driving circuit are all located in different subpixel columns.

In an exemplary embodiment of the present disclosure, a plurality of first light-emitting units and a plurality of first pixel driving circuits are provided. The first pixel driving circuits and the first light-emitting units connected thereto are located in the same row, and each of the first pixel driving circuits is spaced apart from a first light-emitting unit connected thereto by the same sub-pixel column in the row direction In an exemplary embodiment of the present disclosure, a plurality of second light-emitting units and a plurality of second pixel driving circuits are provided, the second pixel driving circuits and the second light-emitting units connected thereto are located in the same row. Each of the second pixel driving circuits is spaced apart from a second light-emitting unit connected thereto by the same sub-pixel column in the row direction.

In an exemplary embodiment of the present disclosure, the first wiring area includes an arc-shaped wiring area and a linear wiring area. The arc-shaped wiring area is located between the first main display area and the second main display area and extends along an arc, and the arc formed by the arc-shaped wiring area protrudes along a direction of the first wiring area away from the light-transmitting area. The third signal line extends along the column direction in the linear wiring area, and the third signal line extends along an arc extending direction of the arc-shaped wiring area in the arc-shaped wiring area. The sixth signal line extends along the column direction in the linear wiring area, and the sixth signal line extends along the arc extending direction of the arc-shaped wiring area in the arc-shaped wiring area.

In an exemplary embodiment of the present disclosure, the arc-shaped wiring area is located at the boundary of the first wiring area.

In an exemplary embodiment of the present disclosure, the display panel further includes second wiring areas. The second wiring areas are located at both sides of the light-transmitting area and the first transitional display area in the column direction. The first wiring area and the second wiring area form a rectangle surrounding around the first transitional display area and the light-transmitting area. The third signal line is also located in the second wiring area, and extends to the second wiring area along the column direction and to the first wiring area along the row direction. The sixth signal line is also located in the second wiring area, and extends to the second wiring area along the column direction and to the first wiring area along the row direction.

In an exemplary embodiment of the present disclosure, the display panel further includes a second transitional display area. The second transitional display area is arranged adjacent to a side of the second wiring area in the column direction. The display panel further includes a fifth light-emitting unit and a fifth pixel driving circuit. The fifth light-emitting unit is located in the second wiring area. The fifth pixel driving circuit is located in the second transitional display area for providing a driving current to the fifth light-emitting unit.

In an exemplary embodiment of the present disclosure, the display panel further includes a sixth sub-pixel located in the second transitional display area. The sixth sub-pixel includes a sixth light-emitting unit, and a sixth pixel driving circuit for providing a driving current to the sixth light-emitting unit. The sixth pixel driving circuit and the fifth pixel driving circuit are located in different sub-pixel columns.

In an exemplary embodiment of the present disclosure, a plurality of fifth pixel driving circuits and a plurality of fifth light-emitting units are provided, and each of the fifth pixel driving circuit is spaced apart from a fifth light-emitting unit connected thereto by the same sub-pixel row in the column direction.

In an exemplary embodiment of this disclosure, the first transitional display area includes a first sub-transitional display area and a second sub-transitional display area, and the second sub-transitional display area is located between the first sub-transitional display area and the first wiring area. The first pixel driving circuit is located in the first sub-transitional display area, and the second pixel driving circuit is located in the second sub-transitional display area.

In an exemplary embodiment of the present disclosure, the first main display area and the second main display area have the same pixel density, and the first wiring area, the first transitional display area and the light-transmitting area have the same pixel density. The pixel density of the first main display area is larger than the pixel density of the light-transmitting area.

In an exemplary embodiment of the present disclosure, the first main display area and the second main display area have the same pixel density, and the first wiring area, the first transitional display area, the light-transmitting area, the second wiring area and the second transitional display area have the same pixel density. The pixel density of the first main display area is larger than the pixel density of the light-transmitting area.

In an exemplary embodiment of this disclosure, a plurality of third signal lines and a plurality of sixth signal lines are provided. The plurality of third signal lines and the plurality of sixth signal lines form a plurality of transfer lines including a plurality of first transfer lines and a plurality of second transfer lines. The display panel further includes a base substrate, a first conductive layer, a second conductive layer and a third conductive layer. The first conductive layer is arranged at a side of the base substrate, and at least a part of the first conductive layer is configured to form the first transfer line. The second conductive layer is arranged at a side of the first conductive layer away from the base substrate, and at least a part of the second conductive layer is configured to form the second transfer line. The third conductive layer is arranged at a side of the second conductive layer away from the base substrate, and at least a part of the third conductive layer is configured to form the first signal line, the second signal line, the fourth signal line and the fifth signal line. An orthographic projection of the first transfer line on the base substrate and an orthographic projection of the second transfer line on the base substrate are sequentially alternately distributed in the vertical direction of an extending direction thereof.

In an exemplary embodiment of the present disclosure, the display panel further comprises a seventh signal line, an eighth signal line and a ninth signal line. The seventh signal line extends along the row direction and is located at a side of the first wiring area away from the light-transmitting area, and is formed by a part of the first conductive layer or a part of the second conductive layer. The eighth signal line extends along the row direction and is at least partially located in the first transitional display area, and is formed by a part of the first conductive layer or a part of the second conductive layer. The ninth signal line extends along the row direction and is located in the first wiring area. The ninth signal line is formed by a part of the third conductive layer, and is connected with the seventh signal line and the eighth signal line through via holes, respectively.

In an exemplary embodiment of the present disclosure, the display panel includes a driving transistor and a capacitor connected to a gate of the driving transistor. A part of the first conductive layer is configured to form the gate of the driving transistor, and a part of the second conductive layer is configured to form an electrode of the capacitor. The first signal line, the second signal line, the fourth signal line and the fifth signal line are configured to provide a data signal to the gate of the driving transistor.

In an exemplary embodiment of the present disclosure, the display panel further includes a fourth conductive layer. The fourth conductive layer is located at a side of the third conductive layer away from the base substrate, and at least a part of the fourth conductive layer is configured to form anodes of the first light-emitting unit and the second light-emitting unit.

In an exemplary embodiment of the present disclosure, the display panel further includes a fifth transparent conductive layer between the third conductive layer and the fourth conductive layer. The fifth transparent conductive layer includes a first connecting line for connecting the first pixel driving circuit and the anode of the first light-emitting unit, and connecting the second pixel driving circuit and the anode of the second light-emitting unit.

In an exemplary embodiment of the present disclosure, the third signal line is located in the first transitional display area.

In an exemplary embodiment of the present disclosure, the display panel further comprises a base substrate, a third conductive layer and a fourth conductive layer. The third conductive layer is arranged at a side of the base substrate, and at least a part of the third conductive layer is configured to form the first signal line and the second signal line. The fourth conductive layer is located at a side of the third conductive layer away from the base substrate, and at least a part of the fourth conductive layer is configured to form the anodes of the first light-emitting unit and the second light-emitting unit. At least a part of the fourth conductive layer is configured to form the third signal line.

According to one aspect of the present disclosure, a display device is provided. The display device includes the display panel as mentioned above and a camera, and the camera is arranged directly facing the light-transmitting area of the display panel.

It shall be understood that the above general description and the following detailed description are merely exemplary and explanatory and are not intended to be restrictive of the present disclosure.

BRIEF DESCRIPTION OF THE DRAWINGS

The accompanying drawings, which are incorporated into and constitute a part of this specification, illustrate embodiments consistent with the present disclosure and together with the description serve to explain the principles of the present disclosure. Obviously, the drawings in the following description are only intended to illustrate some embodiments of the present disclosure, and for those ordinarily skilled in the art, other drawings may be obtained according to these drawings without paying creative efforts.

DETAILED DESCRIPTION

Figure 1:
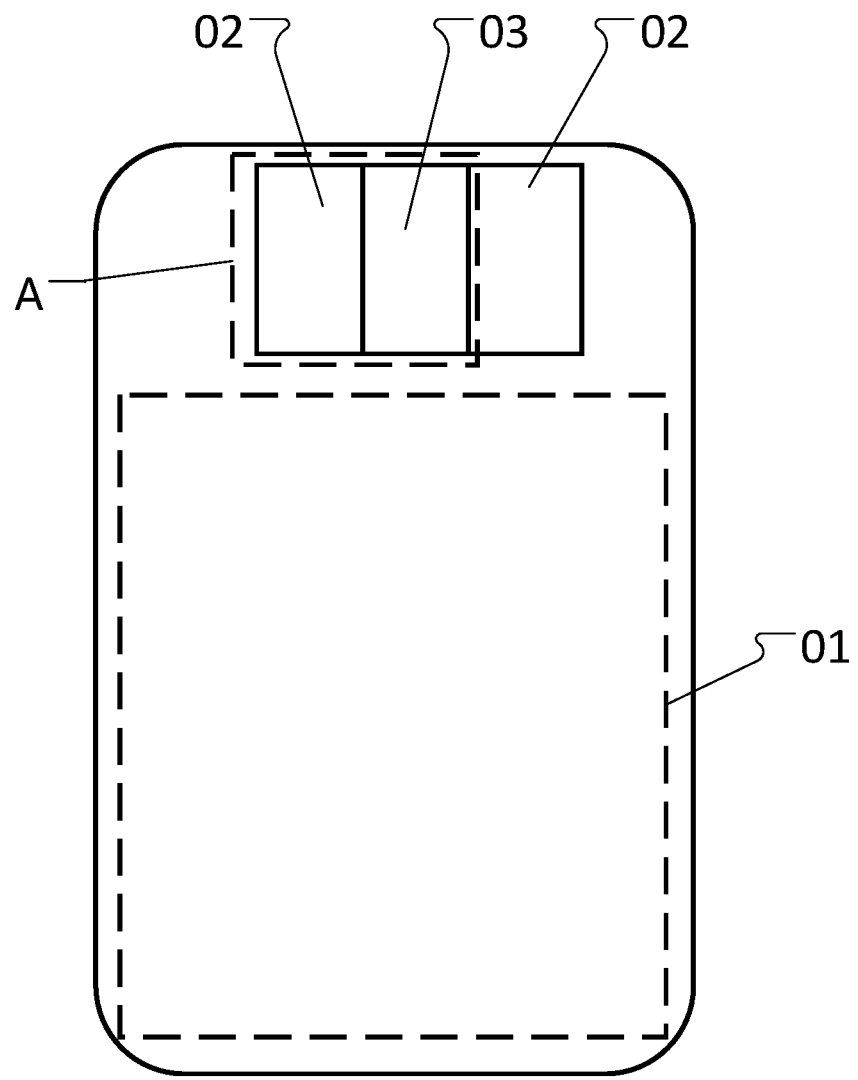
FIG. 1 is a structural schematic view of a display panel in the related art.

Exemplary embodiments will now be described more fully by reference to the accompanying drawings. However, the exemplary embodiments may be implemented in various forms and should not be understood as being limited to the examples set forth herein; rather, the embodiments are provided so that this disclosure will be thorough and complete, and the conception of exemplary embodiments will be fully conveyed to those skilled in the art. The same reference signs in the drawings denote the same or similar structures and detailed description thereof will be omitted.

Although terms having opposite meanings such as "up" and "down" are used herein to describe the relationship of one component relative to another component, such terms are used herein only for the sake of convenience, for example, "in the direction illustrated in the figure". It may be understood that if a device denoted in the drawings is turned upside down, a component described as "above" something will become a component described as "under" something. Other relative terms, such as "high", "low", "top", "bottom", "left" and "right", have similar meanings. When a structure is described as "above" another structure, it probably means that the structure is integrally formed on another structure, or the structure is "directly" disposed on another structure, or the structure is "indirectly" disposed on another structure through an additional structure.

The terms "a", "an", "the", "said" are used to express the presence of one or more the element/constitute/or the like. The terms "comprise", "include" and "have" are intended to be inclusive, and mean there may be additional elements/constituents/or the like other than the listed elements/constituents/or the like.

Figure 2:
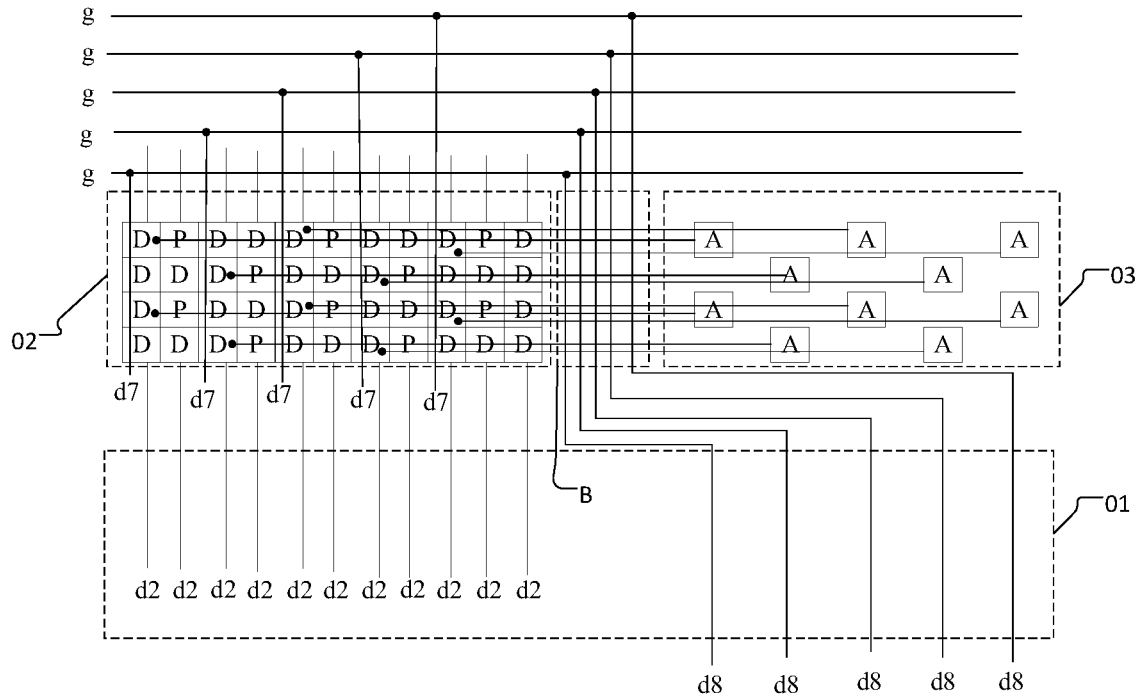
FIG. 2 is a partial enlarged view at a dotted box A in FIG. 1.

As shown in FIGS. 1 and 2, FIG. 1 is a structural schematic view of a display panel in the related art, and FIG. 2 is a partial enlarged view of a dotted box A in FIG. 1. As shown in FIGS. 1 and 2, the display panel includes a main display area 01, a light-transmitting area 03 and a transitional display area 02. As shown in FIG. 2, only light-emitting units A are arranged in the light-transmitting area 03 of the display panel, and sub-pixels P with light-emitting units and pixel driving circuits D without light-emitting units are arranged in the transitional display area 02 of the display panel. The display panel may provide a driving current to the light-emitting units A located in the light transmitting area 03 through the pixel driving circuits D located in the transitional display area 02. The light-transmitting area 03 has a higher light transmittance since there is no pixel driving circuit. As shown in FIG. 2, in order to realize normal driving, data lines d8 located in the same sub-pixel column as the light-emitting units A need to be connected with the pixel driving circuits D that provide a driving current to the light-emitting units A. In the related art, a manner of connecting the data lines d8 to the pixel driving circuits D in the transitional display area 02 may be shown in FIG. 2. The data lines d8 bypass a wire collection area B, and thus connect the data lines d7 in the transitional display area 02 through gate lines g located in an edge wiring area, wherein the data lines d7 are connected to the pixel driving circuits D in the transitional display area 02. When a side of the transitional display area 02 away from the main display area 01 also needs to be provided with a main display area, as shown in FIG. 2, the data lines d2 located in the main display area 01 need to pass through the transitional display area 02 to connect with the main display area at the other side of the transitional display area 02. However, the data lines d7 and part of the data lines d2 are located in the same sub-pixel column, and the data lines d7 and the data lines d2 located in the same sub-pixel column are prone to signal crosstalk.

Figure 3:
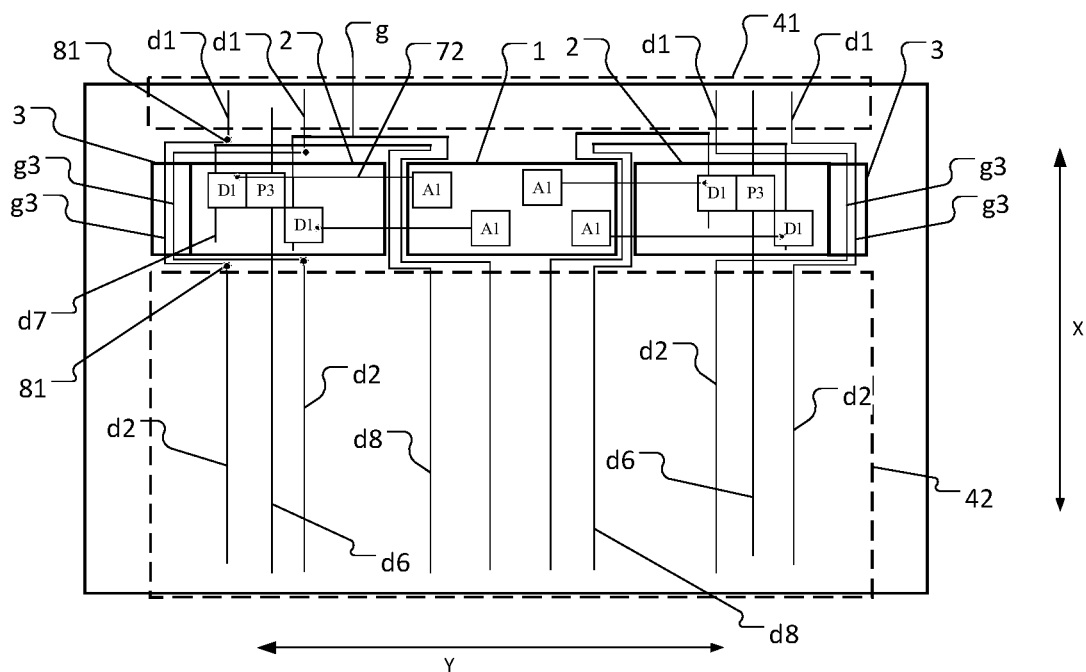
FIG. 3 is a structural schematic view of an exemplary embodiment of a display panel of the present disclosure.

Based on this, this exemplary embodiment provides a display panel, as shown in FIG. 3, FIG. 3 is a structural schematic view of an exemplary embodiment of the display panel of the present disclosure. The display panel may include a light-transmitting area 1, a first transitional display area 2, a first wiring area 3, a first main display area 41 and a second main display area 42. The first transitional display area 2 is located at both sides of the light-transmitting area 1 in a row direction Y, and the first wiring area 3 is located at a side of the first transitional display area 2 away from the light-transmitting area 1. The first main display area 41 is located at a side of the light-transmitting area 1, the first transitional display area 2 and the first wiring area 3 in a column direction X, and the second main display area 42 is located at the other side of the light-transmitting area 1, the first transitional display area 2 and the first wiring area 3 in the column direction X. The display panel further includes first light-emitting units A1, first pixel driving circuits D1, first signal lines d1, second signal lines d2 and third signal lines g3. The first light-emitting units A1 may be located in the light-transmitting area 1. The first pixel driving circuits D1 may be located in the first transitional display area 2, and the first pixel driving circuit D1 may be used to provide a driving current to the first light-emitting units A1. The first signal lines d1 may extend along the column direction X, and the first signal line d1 is at least partially located in the first main display area 41, and is configured to provide driving signal to a pixel driving circuit located in the same sub-pixel column as the first pixel driving circuit D1. The second signal line d2 may extend along the column direction X, and the second signal line d2 is at least partially located in the second main display area 42 and is configured to provide driving signal to a pixel driving circuit located in the same sub-pixel column as the first pixel driving circuit D1. The third signal line g3 may be at least partially located in the first wiring area 3, and the third signal line d3 may be connected with the first signal line d1 and the second signal line d2 through via holes 81, respectively. The first signal line d1 and the second signal line d2 may be data signal lines. The third signal line g3 may be located in a different conductive layer from the first signal line d1, and the third signal line g3 may be located in a different conductive layer from the second signal line d2.

In this exemplary embodiment, the first signal line d1 and the second signal line d2 are connected by the third signal line g3 located in the first wiring area 3, avoiding the occurrence of two data lines in the sub-pixel column where the first pixel driving circuit D1 is located in the first transitional display area 2, and thus avoiding the signal crosstalk between two data lines close to each other.

It should be noted that, in this exemplary embodiment, an expression that "the first area is located at a side of the second area in the column direction" may mean that an area through which the first area moves in the column direction covers the second area.

In this exemplary embodiment, as shown in FIG. 3, the display panel may further include a signal line d7 and a signal line d8. The signal line d7 may be at least partially located in the first transitional display area 2, and may be configured to connect the first pixel driving circuit D1. The signal line d8 may be at least partially located in the second main display area 42, and may be configured to provide a driving signal (such as a data signal) to a sub-pixel unit located in the same sub-pixel column as the first light-emitting unit A1. The signal lines d7 and d8 in this exemplary embodiment may have the same connection structure as those in FIG. 2, and the signal lines d7 and d8 in this exemplary embodiment may be connected through the gate line g. The gate line g may be located between the first main display area 41 and the light-transmitting area 1. The gate line g may be located in a different conductive layer from the signal line d7, and the gate line g may be located in a different conductive layer from the signal line d8.

Figure 4:
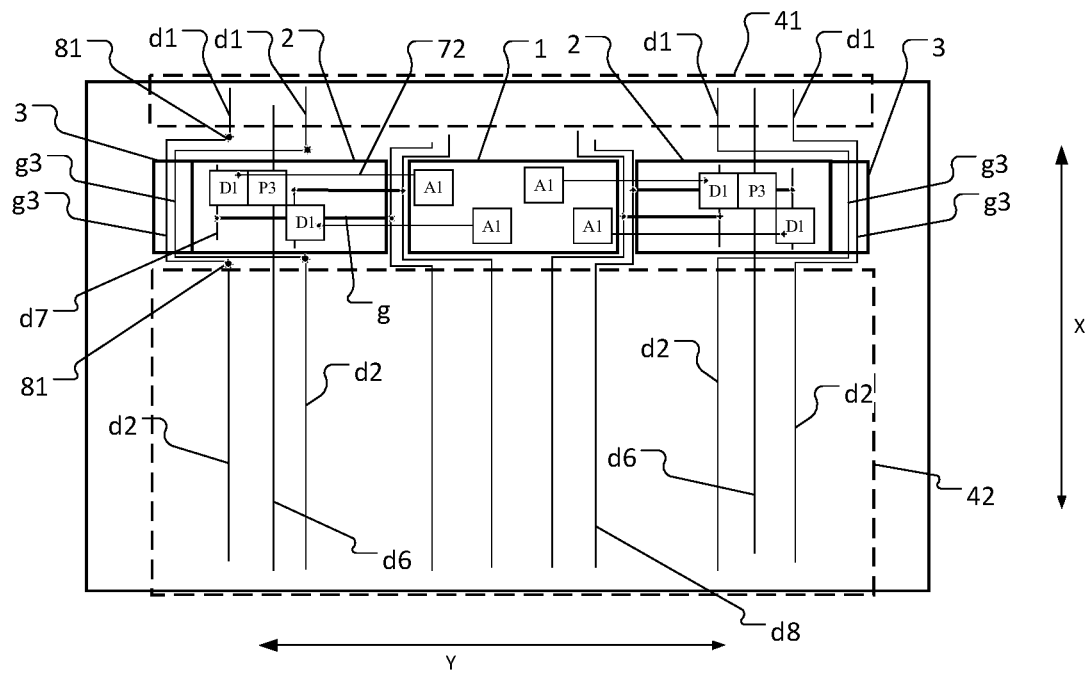
FIG. 4 is a structural schematic view of another exemplary embodiment of a display panel of the present disclosure.

FIG. 4 is a structural schematic view of another exemplary embodiment of the display panel of the present disclosure. In this embodiment, the gate line g may also be formed in the first transitional display area 2, and at least part of sub-pixel rows in the first transitional display area 2 may be correspondingly provided with a gate line g.

Figure 5:
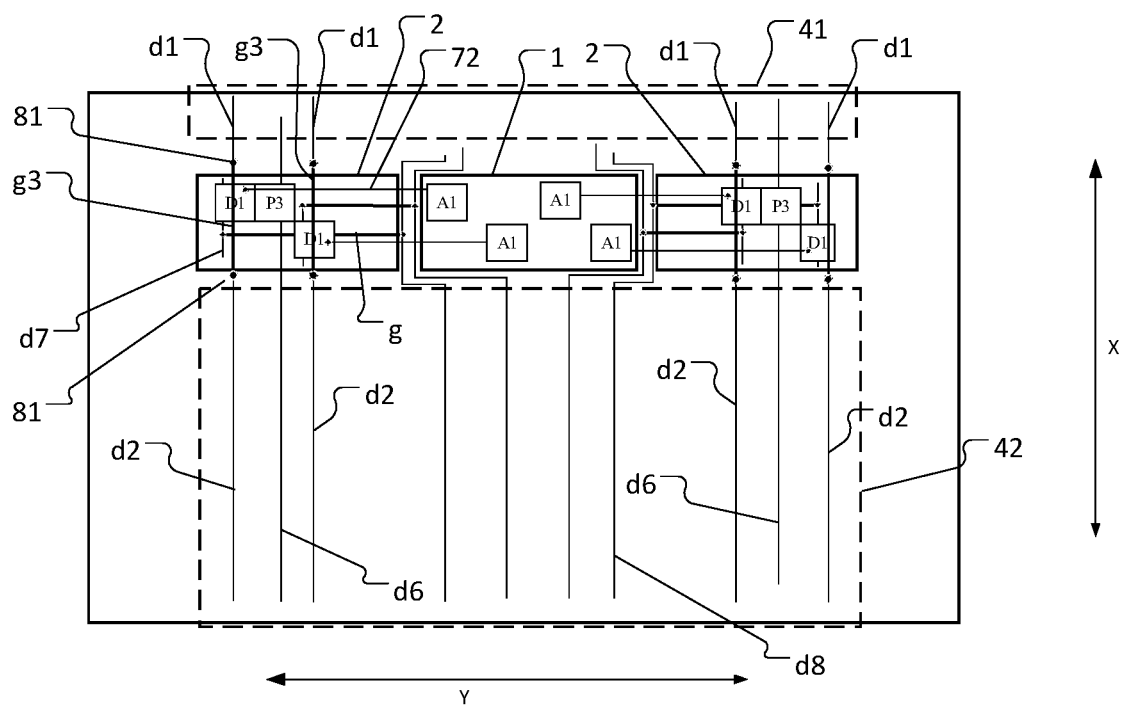
FIG. 5 is a structural schematic view of another exemplary embodiment of a display panel of the present disclosure.

In this exemplary embodiment, the third signal line g3 may also be located in other areas. For example, as shown in FIG. 5, FIG. 5 is a structural schematic view of another exemplary embodiment of the display panel of the present disclosure. In this exemplary embodiment, the display panel may not be provided with the first wiring area, and the third signal line g3 may be at least partially located in the first transitional display area 2. The signal line d7 may be located in the same conductive layer as the first signal line d1 and the second signal line d2. Since the third signal line g3 and the first signal line d1 are located in different conductive layers, and the third signal line g3 and the second signal line d2 are located in different conductive layers, the third signal line g3 and the signal line d7 are located in different conductive layers, so that this arrangement may also reduce the signal crosstalk between the third signal line g3 and the signal line d7.

Figure 6:
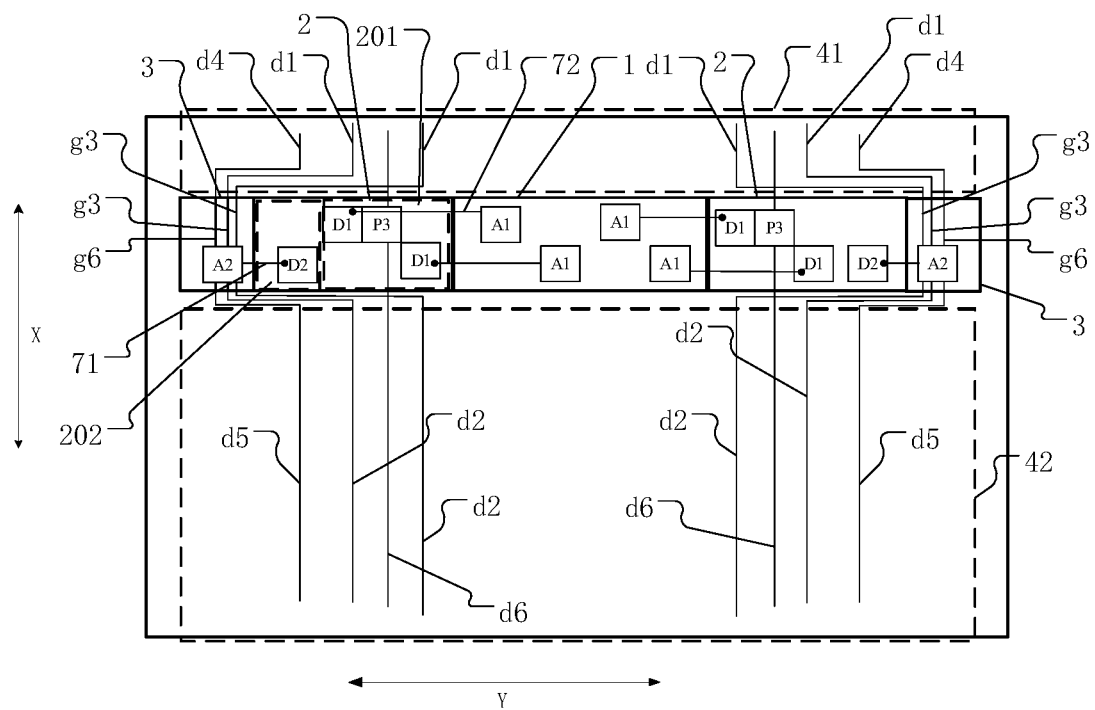
FIG. 6 is a structural schematic view of another exemplary embodiment of a display panel of the present disclosure.

FIG. 6 is a structural schematic view of another exemplary embodiment of the display panel of the present disclosure. The display panel may further include a second light-emitting unit A2, a second pixel driving circuit D2, a fourth signal line d4, a fifth signal line d5 and a sixth signal line g6. The second light-emitting unit A2 may be located in the first wiring area 3; the second pixel driving circuit D2 may be located in the first transitional display area 2, and may be configured to provide a driving current to the second light-emitting unit A2. The fourth signal line d4 may extend along the column direction X, and the fourth signal line d4 is at least partially located in the first main display area 41, and is configured to provide a driving signal to the pixel driving circuit located in the same sub-pixel column as the second pixel driving circuit D2; the fifth signal line d5 may extend along the column direction, and the fifth signal line d5 may be at least partially located in the second main display area 42 for providing a driving signal to the pixel driving circuit located in the same sub-pixel column as the second pixel driving circuit D2; the sixth signal line g6 may be at least partially located in the first wiring area 3, and the sixth signal line g6 may be connected with the fourth signal line d4 and the fifth signal line d5 through via holes, respectively. The fourth signal line d4 and the fifth signal line d5 may be data lines, the sixth signal line g6 and the fourth signal line d4 may be located in different conductive layers, the sixth signal line g6 and the fifth signal line d5 may be located in different conductive layers, and the fourth signal line d4 and the fifth signal line d5 may be located in the same conductive layer. It should be understood that in other exemplary embodiments, the sixth signal line g6 may also be located in the first transitional display area 2, and the sixth signal line g6 may extend along the column direction X to directly connect the fourth signal line d4 and the fifth signal line d5.

In this exemplary embodiment, only the second light-emitting unit may be provided in the first wiring area, and the pixel driving circuit is not provided. The display panel drives the second light-emitting unit A2 through the second pixel driving circuit D2 located in the first transitional display area 2. The display panel may ensure that the first wiring area 3 emits light normally without affecting the normal wiring of the third signal line g3 and the sixth signal line g6 in the first wiring area 3.

In this exemplary embodiment, as shown in FIG. 6, the first transitional display area 2 may include a first sub-transitional display area 201 and a second sub-transitional display area 202, and the second sub-transitional display area 202 may be located between the first sub-transitional display area 201 and the first wiring area 3; the first pixel driving circuit D1 may be located in the first sub-transitional display area 201, and the second pixel driving circuit D2 may be located in the second sub-transitional display area 202. This arrangement may enable the first light-emitting unit A1 to be connected with the pixel driving circuit in the first sub-transitional display area 201 which is closer to the first light-emitting unit, thereby reducing the voltage drop caused by the conductive line resistance between the first light-emitting unit A1 and the first pixel driving circuit D1; while this arrangement may also ensure the second light-emitting unit A2 to be connected with the pixel driving circuit in the second sub-transitional display area 202 which is closer to the second light-emitting unit, thereby reducing the voltage drop caused by the conductive line resistance between the second light-emitting unit A2 and the second pixel driving circuit D2.

In this exemplary embodiment, as shown in FIGS. 3-6, the display panel may further include a third sub-pixel P3. The third sub-pixel P3 may be located in the first transitional display area 2, and may include a third light-emitting unit and a third pixel driving circuit. The third pixel driving circuit may be configured to provide a driving current to the third light-emitting unit. The display panel may further include a data line d6 located in the same sub-pixel column as the third sub-pixel P3. The data line d6 may extend along the column direction and extend through the first transitional display area in the column direction to the first main display area and the second main display area, so that the data line d6 may provide a data signal to the pixel driving circuit located in the same sub-pixel column as the third sub-pixel P3. The third sub-pixel may be located in a different sub-pixel column from the first pixel driving circuit and the second pixel driving circuit. This arrangement may enable the data line d6 for connecting the third sub-pixel P3 to be located in a different sub-pixel column from the data line for connecting the first pixel driving circuit D1 and the data line for connecting the second pixel driving circuit D2, avoiding that a plurality of data lines are located in the same sub-pixel column.

In this exemplary embodiment, as shown in FIGS. 3-6, both the first light-emitting units A1 and the first pixel driving circuits D1 may be provided in plural. The first pixel driving circuits D1 may be located in the same row as the first light-emitting units A1 connected with the first pixel driving circuits, and the first pixel driving circuits D1 may be spaced apart from the first light-emitting units A1 connected thereto by the same sub-pixel column in the row direction. That is, the first pixel driving circuits D1 may be spaced apart from the first light-emitting units A1 connected thereto by the same distance in the row direction. This arrangement may enable the second connecting lines 72 connecting the first pixel driving circuits D1 and the first light-emitting units A1 have the same length, that is, each of the connecting lines has the same voltage drop under the same voltage, so that the display panel may have better display uniformity.

In this exemplary embodiment, the second light-emitting unit A2 and the second pixel driving circuit D2 may both be provided in plural, the second pixel driving circuits D2 may be located in the same row as the second light-emitting units A2 connected thereto, and the second pixel driving circuits D2 may be spaced apart from the second light-emitting units A2 connected thereto by the same sub-pixel column in the row direction. That is, the second pixel driving circuits D2 may be spaced apart from the second light-emitting units A2 connected thereto by the same distance in the row direction. This arrangement may enable the first connecting lines 71 connecting the second pixel driving circuits D2 and the second light-emitting units A2 have the same length, that is, each of the connecting lines has the same voltage drop under the same voltage, so that the display panel may have better display uniformity.

Figure 7:
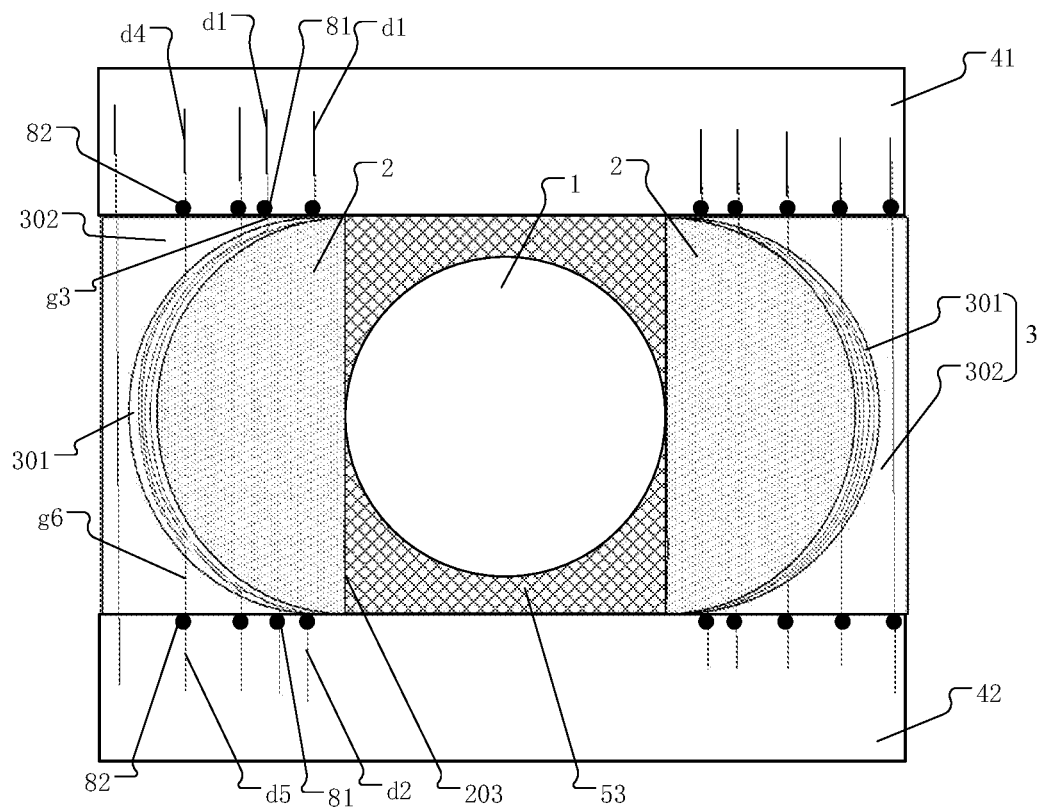
FIG. 7 is a structural schematic view of another exemplary embodiment of a display panel of the present disclosure.

In this exemplary embodiment, as shown in FIG. 7, FIG. 7 is a structural schematic view of another exemplary embodiment of the display panel of the present disclosure. The first wiring area 3 may include an arc-shaped wiring area 301 and a linear wiring area 302. The arc-shaped wiring area 301 may be located between the first main display area 41 and the second main display area 42 and extend along an arc. The arc of the arc-shaped wiring area 301 may protrude along a direction of the first wiring area 3 away from the light-transmitting area 1. The third signal line g3 may extend along the column direction X in the linear wiring area 302, and the third signal line g3 may extend along an arc extending direction of the arc-shaped wiring area in the arc-shaped wiring area 301. Similarly, the sixth signal line g6 may extend along the column direction in the linear wiring area 302, and the sixth signal line g6 may extend along the arc extending direction of the arc-shaped wiring area in the arc-shaped wiring area 301. The third signal line g3 may be connected to the first signal line d1 and the second signal line d2 through via holes 81, respectively. The sixth signal line g6 may be connected to the fourth signal line d4 and the fifth signal line d5 through via holes 82. The via holes 81 and 82 may be arranged near edges of the first wiring area 3 at both sides thereof in the column direction, for example, the via holes 81 and 82 may be arranged on the edges of the first wiring area 3 at both sides thereof in the column direction. The arc-shaped wiring area 301 may be located at a boundary of the first wiring area 3. As shown in FIG. 7, the light-transmitting area 1 may be circular. The first transitional display area 2 may include a boundary 203 facing a side of the light-transmitting area 1. The boundary 203 may be in a straight line, and the straight line where the boundary 203 is located may be tangent to the circular light-transmitting area 1. The arc-shaped wiring area 301 may extend to the straight line where the boundary 203 is located. The display panel may further include a third transitional display area 53 surrounding around the light-transmitting area 1. The first main display area 41 and the second main display area 42 may have the same pixel density, and the first wiring area 3, the first transitional display area 2, the light-transmitting area 1 and the third transitional display area 53 may have the same pixel density. The pixel density of the first main display area 41 may be larger than the pixel density of the light-transmitting area 1.

Figure 8:
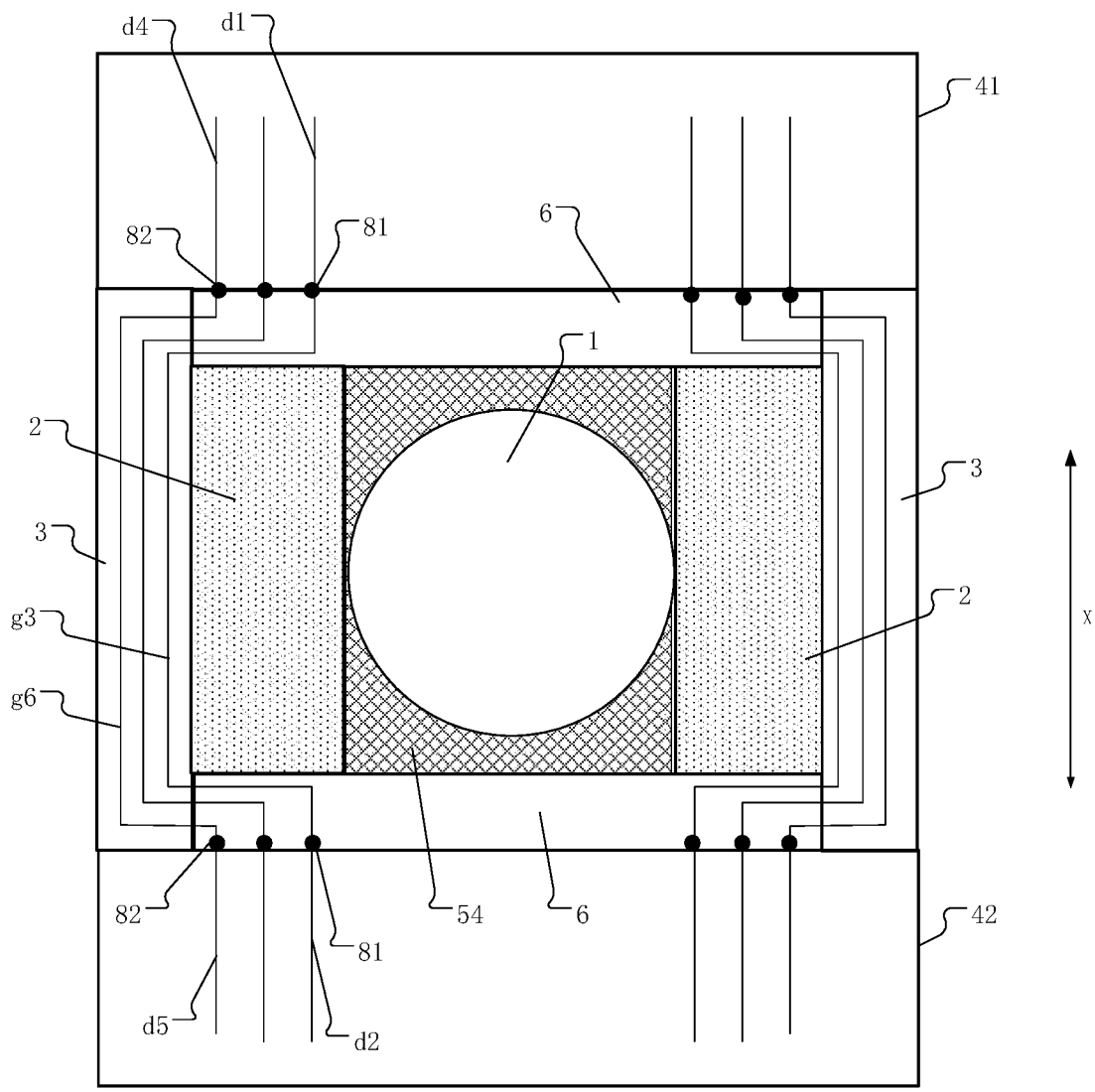
FIG. 8 is a structural schematic view of another exemplary embodiment of a display panel of the present disclosure.

In this exemplary embodiment, as shown in FIG. 8, FIG. 8 is a structural schematic view of another exemplary embodiment of the display panel of the present disclosure. The display panel may further include second wiring areas 6, which may be located at both sides of the light-transmitting area 1 and the first transitional display areas 2 in the column direction X. The first wiring area 3 and the second wiring area 6 may form a rectangle surrounding around the first transitional display areas 2 and the light-transmitting area 1. The third signal line g3 may also be located in the second wiring area 6. The third signal line g3 may extend to the second wiring area 6 along the column direction X and to the first wiring area 3 along the row direction Y The sixth signal line g6 may also be located in the second wiring area 6, and may extend to the second wiring area 6 along the column direction X and to the first wiring area 3 along the row direction Y The third signal line g3 may be connected to the first signal line d1 and the second signal line d2 through via holes 81, respectively. The sixth signal line g6 may be connected to the fourth signal line d4 and the fifth signal line d5 through via holes 82, respectively. The via holes 81 and 82 may be arranged near an edge of the second wiring area 6 away from the light-transmitting area 1, for example, the via holes 81 and 82 may be arranged on the edge of the second wiring area 6 at a side thereof away from the light-transmitting area 1.

As shown in FIG. 8, the display panel may further include a fourth transitional display area 54 surrounding around the light-transmitting area 1. In this exemplary embodiment, the first main display area 41 and the second main display area 42 may have the same pixel density, and the first wiring area 3, the first transitional display area 2, the light-transmitting area 1, the second wiring area 6 and the fourth transitional display area 54 may have the same pixel density. The pixel density of the first main display area 41 may be larger than the pixel density of the light-transmitting area 1.

Figure 9:
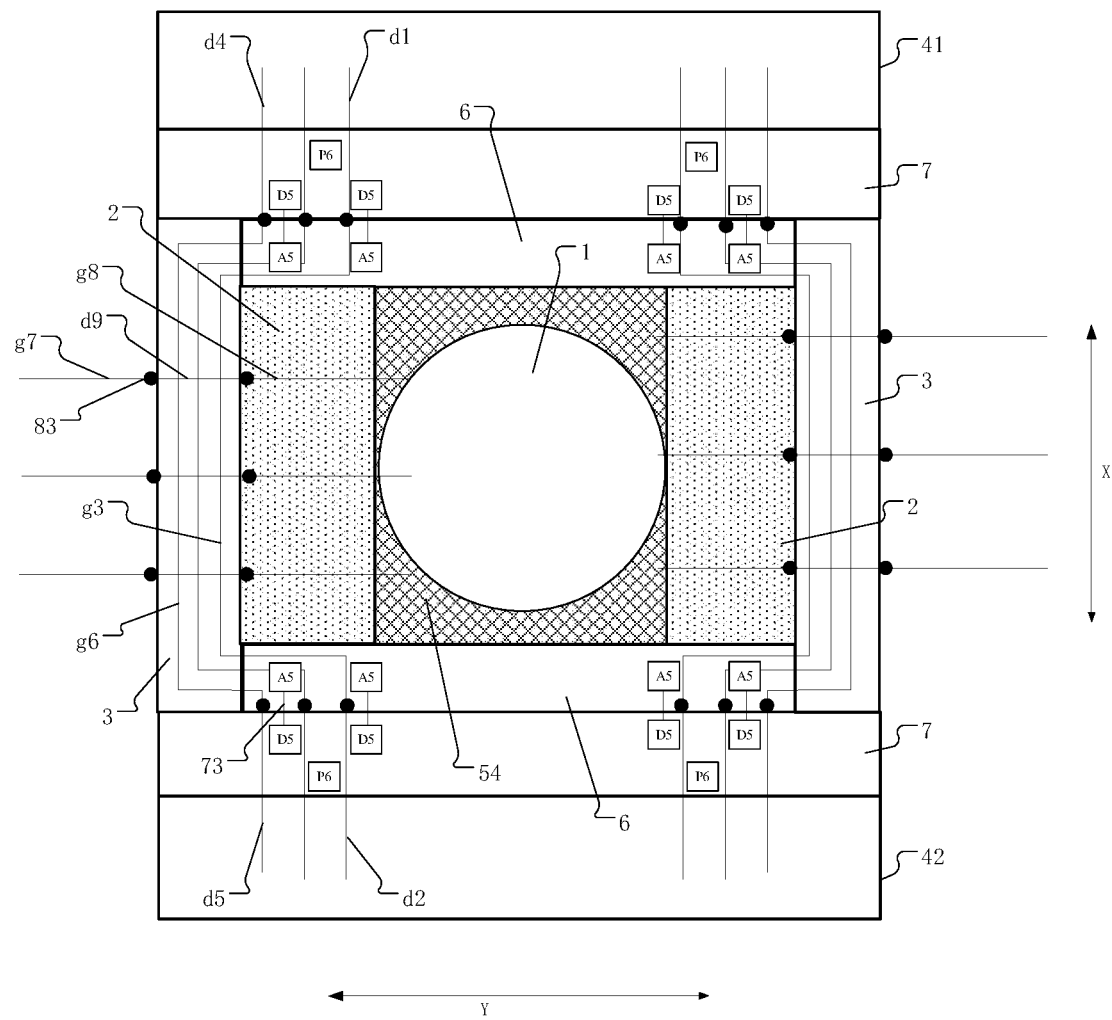
FIG. 9 is a structural schematic view of another exemplary embodiment of a display panel of the present disclosure.

In this exemplary embodiment, as shown in FIG. 9, FIG. 9 is a structural schematic view of another exemplary embodiment of the display panel of the present disclosure. The display panel may further include a second transitional display area 7, which is arranged adjacent to a side of the second wiring area 6 in the column direction. The display panel may further include a fifth light-emitting unit A5 and a fifth pixel driving circuit D5, and the fifth light-emitting unit A5 may be located in the second wiring area 6. The fifth pixel driving circuit D5 may be located in the second transitional display area 7, and the fifth pixel driving circuit D5 may be configured to provide a driving current to the fifth light-emitting unit. In this exemplary embodiment, only the fifth light-emitting unit A5 may be provided in the second wiring area 6, and the pixel driving circuit is not provided. The display panel may drive the fifth light-emitting unit A5 through the fifth pixel driving circuit D5 located in the second transitional display area 7. Therefore, the display panel may ensure that the second wiring area 6 emits light normally without affecting the normal wiring of the third signal line g3 and the sixth signal line g6 in the second wiring area 6.

In this exemplary embodiment, as shown in FIG. 9, the display panel further includes sixth sub-pixels P6, which may be located in the second transitional display area 7. The sixth sub-pixel P6 may include a sixth light-emitting unit and a sixth pixel driving circuit, and the sixth pixel driving circuit may be configured to provide a driving current to the sixth light-emitting unit. The sixth sub-pixel P6 and the fifth pixel driving circuit may be located in different sub-pixel columns. This arrangement may enable the data line for connecting the fifth pixel driving circuit D5 and the data line for connecting the sixth sub-pixel P6 to be located in different sub-pixel columns, avoiding the overlapping of the two data lines in the same sub-pixel column. The fifth pixel driving circuit D5 may also be located in a different sub-pixel column from the first pixel driving circuit D1, so that the data line for connecting the fifth pixel driving circuit D5 may extend through the second wiring area and the second transitional display area to the first main display area and the second main display area, respectively. The sixth sub-pixel P6 may also be located in a different sub-pixel column from the first pixel driving circuit, so that the data line for connecting the sixth sub-pixel P6 may extend through the second wiring area and the second transitional display area to the first main display area and the second main display area, respectively.

In this exemplary embodiment, as shown in FIG. 9, the second transitional display area 7 may be arranged adjacent to a side of the second wiring area away from the light-transmitting area 1. It should be understood that in other exemplary embodiments, the second transitional display area 7 may also be arranged adjacent to a side of the second wiring area facing the light-transmitting area 1.

In this exemplary embodiment, the fifth pixel driving circuit D5 and the fifth light-emitting unit A5 may be provided in plural, and the fifth pixel driving circuits D5 may be spaced apart from the fifth light-emitting unit A5 connected thereto by the same sub-pixel row in the column direction. That is, the fifth pixel driving circuits D5 may be spaced apart from the fifth light-emitting units A5 connected thereto by the same distance in the row direction. This arrangement may enable the connecting lines 73 connected between the five-pixel driving circuits D5 and the fifth light-emitting units A5 have the same length, and each of the connecting lines 73 has the same voltage drop under the same voltage, so that the display panel may have better display uniformity.

In this exemplary embodiment, as shown in FIGS. 7, 8 and 9, the light-transmitting area 1 may be circular, and it should be understood that in other exemplary embodiments, the light-transmitting area 1 may also be rectangular, oval, or the like.

Figure 10:
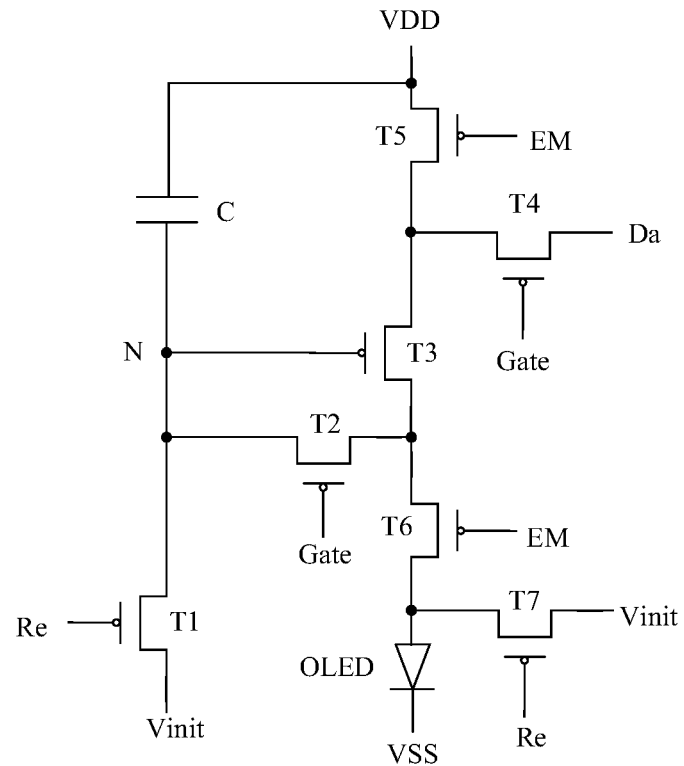
FIG. 10 is a structural schematic view of a first pixel driving circuit in an exemplary embodiment of a display panel of the present disclosure.

In this exemplary embodiment, as shown in FIG. 10, FIG. 10 is a structural schematic view of the first pixel driving circuit in an exemplary embodiment of the display panel of the present disclosure. The pixel driving circuit may include a first transistor T1, a second transistor T2, a driving transistor T3, a fourth transistor T4, a fifth transistor T5, a sixth transistor T6, a seventh transistor T7 and a capacitor C. The first transistor T1 has a first electrode connected to a node N, a second electrode connected to an initialization signal terminal Vinit, and a gate connected to a reset signal terminal Re. The second transistor T2 has a first electrode connected to the first electrode of the driving transistor T3, a second electrode connected to the node N, and a gate connected to a gate driving signal terminal Gate. A gate of the driving transistor T3 is connected to the node N. The fourth transistor T4 has a first electrode connected to a data signal terminal Da, a second electrode connected to a second electrode of the driving transistor T3, and a gate connected to the gate driving signal terminal Gate. The fifth transistor T5 has a first electrode connected to a first power signal terminal VDD, a second electrode connected to the second electrode of the driving transistor T3, and a gate connected to an enable signal terminal EM. The sixth transistor T6 has a first electrode connected to the first electrode of the driving transistor T3, and a gate connected to the enable signal terminal EM. The seventh transistor T7 has a first electrode connected to the initialization signal terminal Vinit, and a second electrode connected to a second electrode of the sixth transistor T6. The pixel driving circuit may be connected with a light-emitting unit OLED for driving the light-emitting unit OLED to emit light, and the light-emitting unit OLED may be connected between the second electrode of the sixth transistor T6 and a second power supply terminal VSS. The transistors T1-T7 may all be P-type transistors. Other pixel driving circuits in the display panel may have the same structure as the first pixel driving circuit.

Figure 11:
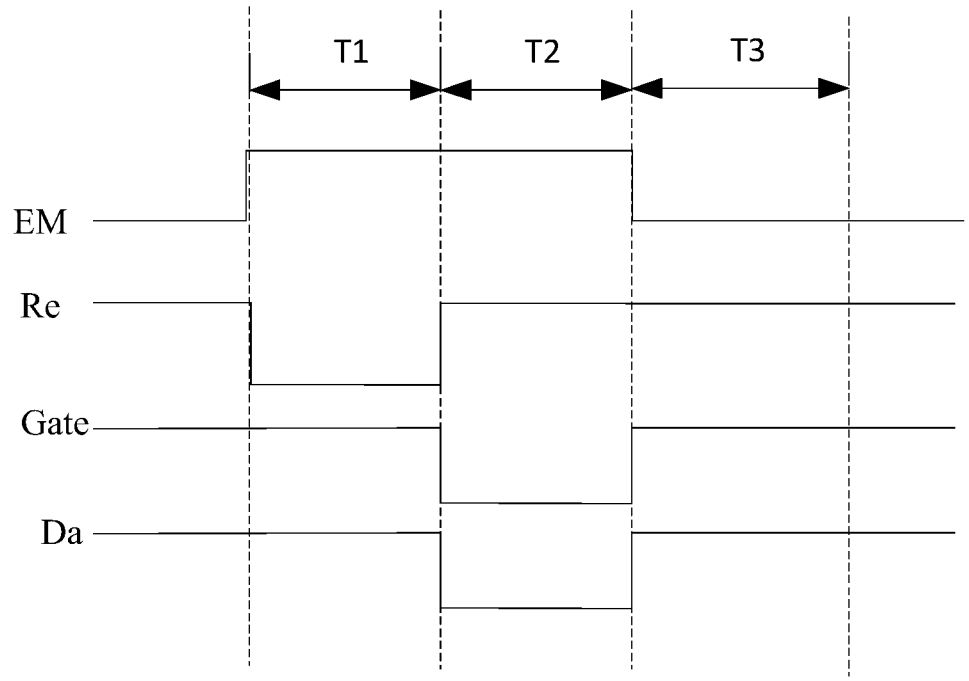
FIG. 11 is a timing diagram of nodes in a driving method of the pixel driving circuit of FIG. 10.

FIG. 11 is a timing diagram of nodes in a driving method of the pixel driving circuit of FIG. 10. In FIG. 11, "Gate" represents timing of the gate driving signal terminal Gate, "Re" represents timing of the reset signal terminal Re, "EM" represents timing of the enable signal terminal EM, and "Da" represents timing of the data signal terminal Da. The driving method of the pixel driving circuit may include a reset stage t1, a compensation stage t2 and a light-emitting stage t3. In the reset stage t1, the reset signal terminal Re outputs a low-level signal, the first transistor T1 and the seventh transistor T7 are conducted, and the initialization signal terminal Vinit inputs an initialization signal to the node N and the second electrode of the sixth transistor T6. In the compensation stage t2, the gate driving signal terminal Gate outputs a low-level signal, the fourth transistor T4 and the second transistor T2 are conducted, and the data signal terminal Da outputs a driving signal to write a voltage Vdata+Vth to the node N, wherein Vdata is a voltage of the driving signal and Vth is a threshold voltage of the driving transistor T3. In the light-emitting stage t3, the enable signal terminal EM outputs a low-level signal, the sixth transistor T6 and the fifth transistor T5 are conducted, and the driving transistor T3 emits light under the action of the voltage Vdata+Vth stored in the capacitor C. According to the formula $I=(\mu WCox/2L)(Vgs-Vth)^2$ of an output current of the driving transistor, where is a carrier mobility; Cox is a gate capacitance per unit area, W is a width of the driving transistor channel, L is a length of the driving transistor channel, Vgs is a gate-source voltage difference of the driving transistor, and Vth is a threshold voltage of the driving transistor. The output current of the driving transistor in the pixel driving circuit of the present disclosure is $I=(\mu WCox/2L)(Vdata+Vth-Vdd-Vth)^2$. The pixel driving circuit may avoid the influence of the threshold of the driving transistor on its output current.

Figure 12:
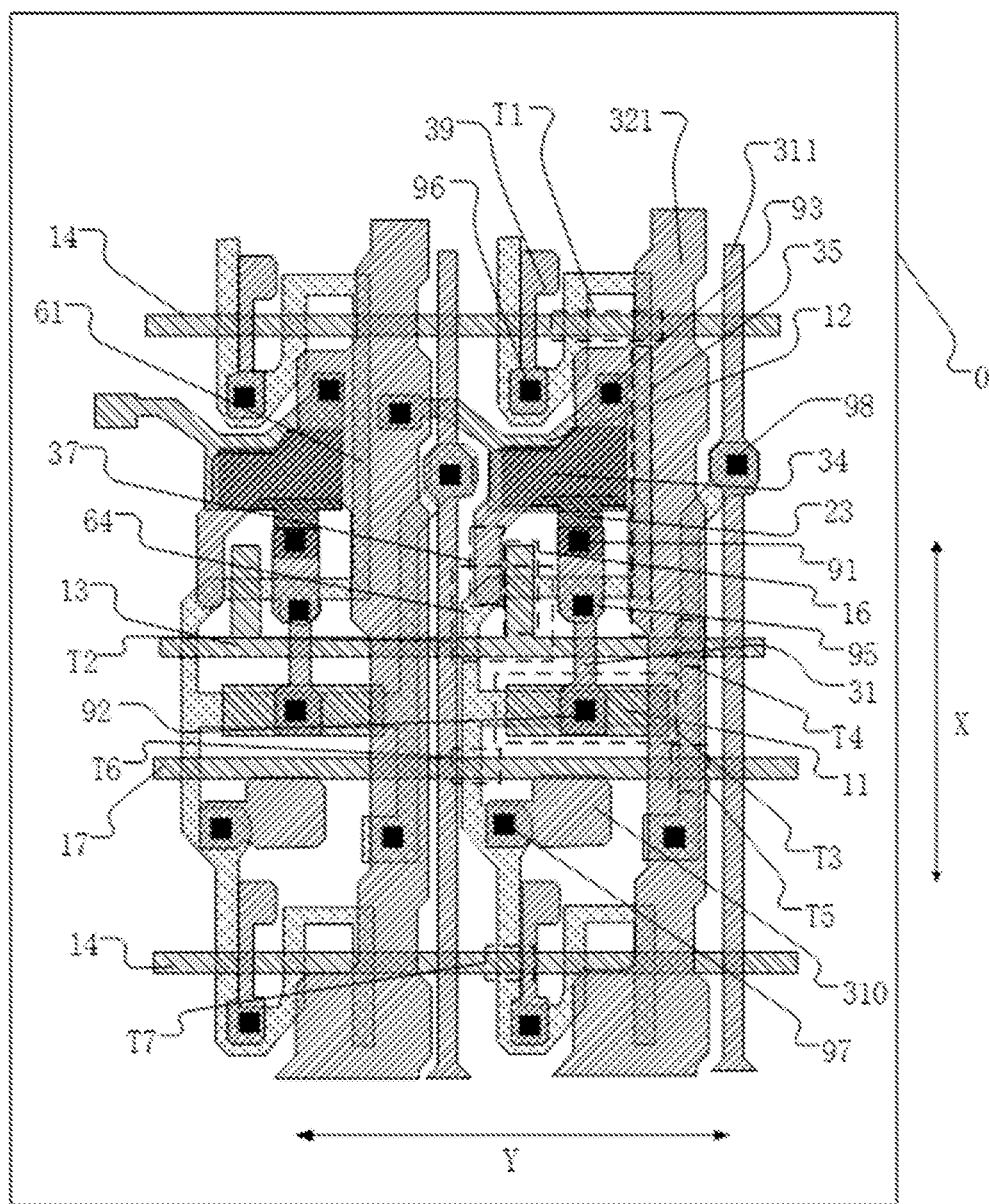
FIG. 12 is a structural layout of an exemplary embodiment of a display panel of the present disclosure.
Figure 13:
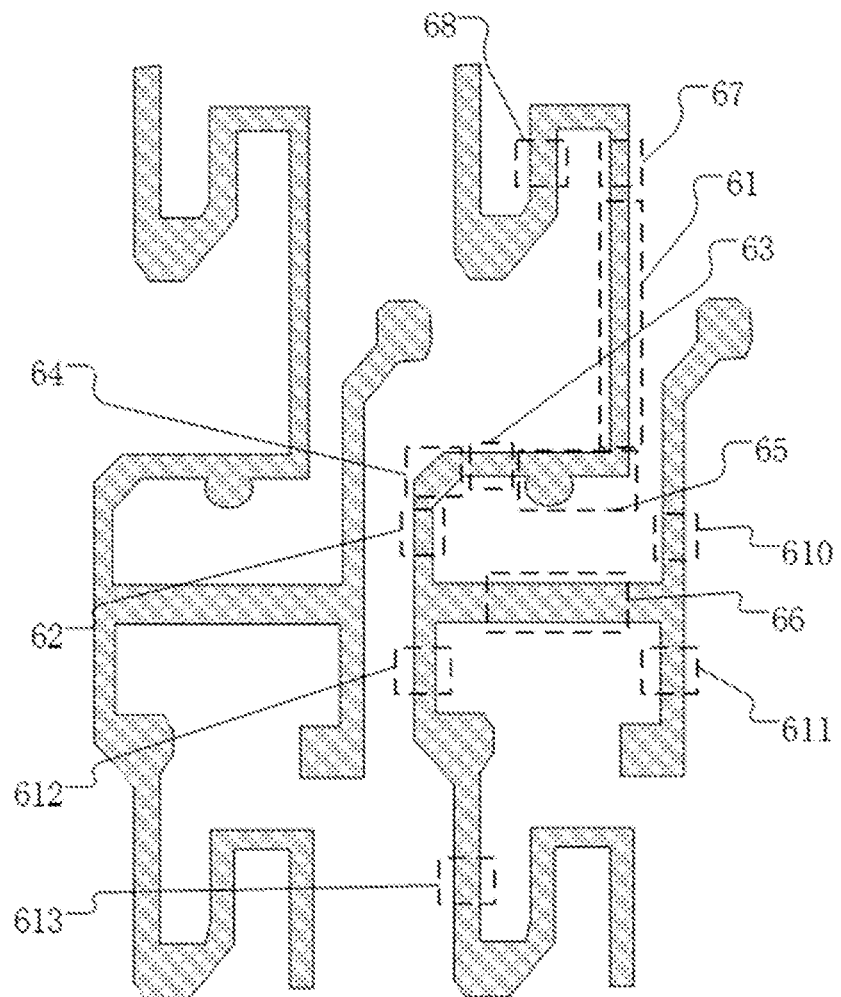
FIG. 13 is a structural layout of an active layer in FIG. 12.
Figure 14:
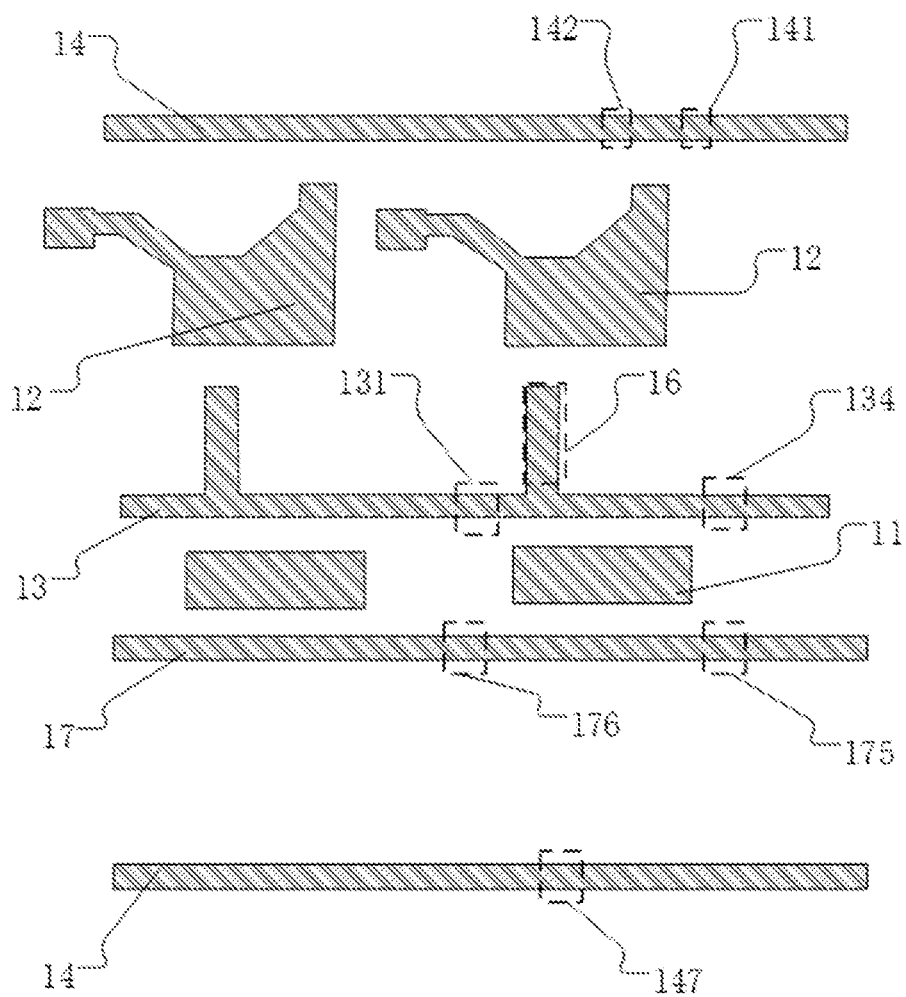
FIG. 14 is a structural layout of a first conductive layer in FIG. 12.
Figure 15:
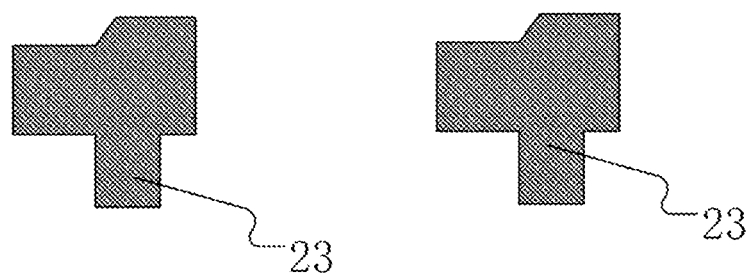
FIG. 15 is a structural layout of a second conductive layer in FIG. 12.
Figure 16:
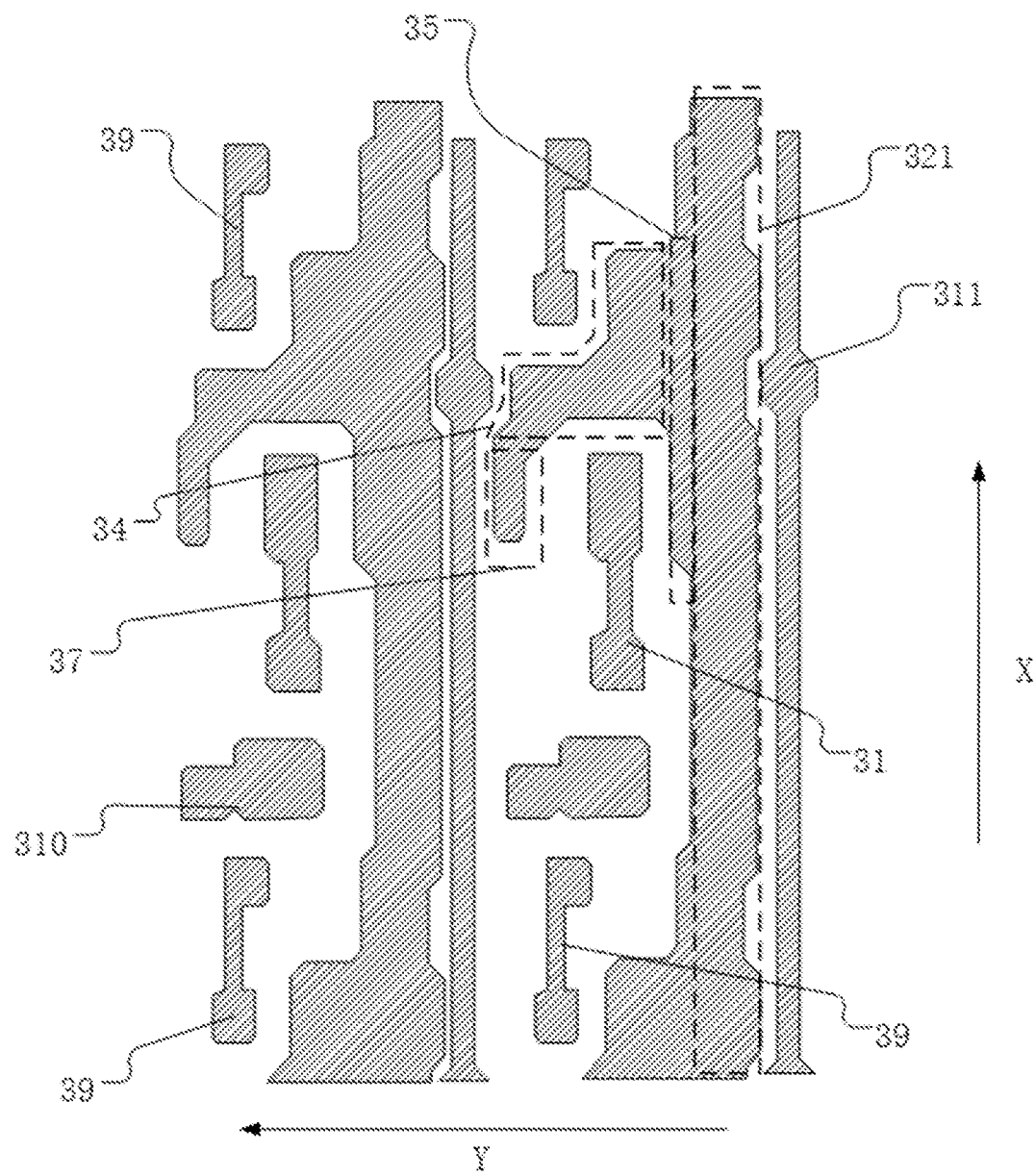
FIG. 16 is a structural layout of a third conductive layer in FIG. 12.

In this exemplary embodiment, the display panel may include a base substrate 0, an active layer, a first conductive layer, a second conductive layer and a third conductive layer which are sequentially stacked. As shown in FIGS. 12, 13, 14, 15 and 16, FIG. 12 is a structural layout of an exemplary embodiment of the display panel of the present disclosure, FIG. 13 is a structural layout of the active layer in FIG. 12, FIG. 14 is a structural layout of the first conductive layer in FIG. 12, FIG. 15 is a structural layout of the second conductive layer in FIG. 12, and FIG. 16 is a structural layout of the third conductive layer in FIG. 12.

As shown in FIGS. 12 and 13, the active layer may include a first active portion 61, a second active portion 62, a third active portion 63, a fourth active portion 64, a fifth active portion 65, a sixth active portion 66, a seventh active portion 67, an eighth active portion 68, a tenth active portion 610, an eleventh active portion 611, a twelfth active portion 612 and a thirteenth active portion 613. The second active portion 62 may be configured to form a first channel area of the second transistor T2, and the third active portion 63 may be configured to form a second channel area of the second transistor T2. The sixth active portion 66 may be configured to form a channel area of the driving transistor T3. The seventh active portion 67 may be configured to form a first channel area of the first transistor T1, and the eighth active portion 68 may be configured to form a second channel area of the first transistor T1. The tenth active portion 610 may be configured to form a channel area of the fourth transistor T4. The eleventh active portion 611 may be configured to form a channel area of the fifth transistor T5. The twelfth active portion 612 may be configured to form a channel area of the sixth transistor T6. The thirteenth active portion 613 may be configured to form a channel area of the seventh transistor. The fourth active portion 64 may be connected between the second active portion 62 and the third active portion 63.

As shown in FIGS. 12 and 14, the first conductive layer may include a first conductive portion 11, a second conductive portion 12, a first gate line 13, a second gate line 14, a third gate line 17 and a sixth conductive portion 16. The first conductive portion 11 may also be a strip-shaped structure extending along the row direction Y. An orthographic projection of the first conductive portion 11 on the base substrate may cover an orthographic projection of the sixth active portion 66 on the base substrate to form the gate of the driving transistor T3. The second conductive portion 12 may be configured to form a part of a first electrode of the capacitor C. The first gate line 13 may be configured to provide the gate driving signal terminal in FIG. 10. An orthographic projection of the first gate line 13 on the base substrate may extend along the row direction Y, and the orthographic projection of the first gate line 13 on the base substrate may be located between the orthographic projection of the first conductive portion 11 on the base substrate and the orthographic projection of the second conductive portion 12 on the base substrate. A part conductive portion 131 of the first gate line 13 may be configured to form the first gate of the second transistor T2, and a part conductive portion 134 of the first gate line 13 may be configured to form the gate of the fourth transistor T4. The second gate line 14 may be configured to provide the reset signal terminal in FIG. 10. An orthographic projection of the second gate line 14 on the base substrate extends along the row direction Y, and the orthographic projection of the second gate line 14 on the base substrate may be located at a side of the orthographic projection of the second conductive portion 12 on the base substrate away from the orthographic projection of the first gate line 13 on the base substrate. A part conductive portion 141 of the second gate line 14 may be configured to form a first gate of the first transistor T1, and a part conductive portion 142 of the second gate line 14 may be configured to form a second gate of the first transistor T1. The third gate line 17 may be configured to provide the enable signal terminal in FIG. 10. An orthographic projection of the third gate line 17 on the base substrate may be located at a side of the orthographic projection of the first conductive portion 11 on the base substrate away from the orthographic projection of the first gate line 13 on the base substrate. The third gate line 17 may include a conductive portion 175 and a conductive portion 176. The conductive portion 175 may be configured to form a gate of the fifth transistor, and the conductive portion 176 may be configured to form a gate of the sixth transistor. A gate of the seventh transistor T7 may share a conductive portion 147 in the second gate line 14 corresponding to the pixel units in the next row. An orthographic projection of the sixth conductive portion 16 on the base substrate may extend along the column direction X and may be connected to the first gate line 13, and a part of the sixth conductive portion 16 may be configured to form the second gate of the second transistor T2.

As shown in FIGS. 12 and 15, the second conductive layer may include a third conductive portion 23. An orthographic projection of the third conductive portion 23 on the base substrate may at least partially overlap with the orthographic projection of the second conductive portion 12 on the base substrate, and the third conductive portion 23 is electrically connected with the first conductive portion 11. The third conductive portion 23 may be configured to form a second electrode of the capacitor C.

As shown in FIGS. 12 and 16, the third conductive layer may include a fourth conductive portion 34, a first connecting portion 31, a power line 321, a fifth conductive portion 35, a seventh conductive portions 37, a second connecting portion 39, a third connecting portion 310 and a data line 311. The fifth conductive portion 35 may be connected between the fourth conductive portion 34 and the power line 321. An orthographic projection of the fourth conductive portion 34 on the base substrate may at least partially overlap with the orthographic projection of the third conductive portion 23 on the base substrate, and the fourth conductive portion 34 may be electrically connected with the second conductive portion 12 through a via hole 93 and configured to form a part of the first electrode of the capacitor C. An orthographic projection of the fifth conductive portion 35 on the base substrate at least partially overlaps with an orthographic projection of the first active portion 61 on the base substrate. The seventh conductive portion 37 may be connected to the fourth conductive portion 34, and an orthographic projection of the seventh conductive portion 37 on the base substrate may at least partially overlap with an orthographic projection of the fourth active portion 64 on the base substrate. The second connecting portion 39 may be connected to the active layer at a side of the eighth active portion 68 through a via hole 96 to connect the second electrode of the first transistor T1. The third connecting portion 310 may connect the active layer between the twelfth active portion 612 and the thirteenth active portion 613 through a via hole 97 to connect the second electrode of the sixth transistor T6 and the second electrode of the seventh transistor T7. The first electrode of the seventh transistor T7 may be connected to the second connecting portion 39 in the next row of pixel units. The data line 311 may be connected to the first electrode of the fourth transistor T4 through a via hole 98. The first connecting portion 31 may be electrically connected with the first conductive portion 11 through a via hole 92, and the first connecting portion 31 may be electrically connected with a second sub-conductive portion 232 through a via hole 91. The fifth active portion 65 may be electrically connected with the first connecting portion 31 through a via hole 95, so that the second electrode of the second transistor T2 is electrically connected with the gate of the driving transistor.

In this exemplary embodiment, the display panel may further include a fifth transparent conductive layer at a side of the third conductive layer facing away from the base substrate, a fourth conductive layer at a side of the fifth transparent conductive layer facing away from the base substrate, and an organic light-emitting layer at a side of the fourth conductive layer facing away from the base substrate. The fourth conductive layer may be configured to form an anode of the light-emitting unit, and the organic light-emitting layer may be configured to form a light-emitting layer of the light-emitting unit. It should be understood that in other exemplary embodiments, the first pixel driving circuit may have other structures, and correspondingly, the display panel may have other corresponding layout structures.

In this exemplary embodiment, as shown in FIGS. 3-9, the third signal line g3 and the sixth signal line g6 may be located in any one or both of the first conductive layer and the second conductive layer. In this exemplary embodiment, the third signal line may be provided in plural, the sixth signal line may be provided in plural, and a plurality of third signal lines and a plurality of sixth signal lines may form a plurality of transfer lines. The transfer lines include a plurality of first transfer lines and a plurality of second transfer lines. At least a part of the first conductive layer is configured to form the first transfer lines, and at least a part of the second conductive layer is configured to form the second transfer lines. An orthographic projection of the first transfer line on the base substrate and the orthographic projection of the second transfer line on the base substrate may be sequentially alternately distributed in the vertical direction of an extending direction thereof. In the display panel, the plurality of transfer lines are arranged in different conductive layers, so that an integration degree of the transfer lines may be increased, that is, more third signal lines g3 and sixth signal lines g6 may be integrated in a limited size in the column direction.

In this exemplary embodiment, as shown in FIGS. 3-9, at least a part of the third conductive layer may be configured to form the first signal line d1, the second signal line d2, the fourth signal line d4 and the fifth signal line d5. Each of the first signal line d1, the second signal line d2, the fourth signal line d4 and the fifth signal line d5 may be a data line, that is, the data line 311 as shown in FIG. 16. In this exemplary embodiment, as shown in FIGS. 5 and 6, the connecting lines 72 and 71 may be formed by a part of the fifth transparent conductive layer. As shown in FIG. 9, the connecting line 73 may be formed of a part of the anode layer. In this exemplary embodiment, as shown in FIG. 5, the third signal line g3 may be formed of a part of the anode layer.

In this exemplary embodiment, as shown in FIG. 9, the transfer line formed by the third signal line g3 or the sixth signal line g6 is located in the first conductive layer and extends along the column direction, and as shown in FIG. 14, the first gate line 13, the second gate line 14 and the third gate line 17 are located in the first conductive layer and extend along the row direction, so that the transfer line mentioned above may intersect with the gate line, thereby causing abnormal display of the display panel.

In this exemplary embodiment, as shown in FIG. 9, the display panel further includes a seventh signal line g7, an eighth signal line g8, and a ninth signal line d9. The seventh signal line g7 may extend along the row direction and is located at a side of the first wiring area 3 away from the light-transmitting area 1. The seventh signal line g7 may be formed by a part of the first conductive layer or a part of the second conductive layer. The eighth signal line g8 may extend along the row direction and may be at least partially located in the first transitional display area, and the eighth signal line g8 may be formed by a part of the first conductive layer or a part of the second conductive layer. The ninth signal line d9 may extend along the row direction and may be located in the first wiring area 3. The ninth signal line d9 may be formed by a part of the third conductive layer, and may be connected with the seventh signal line g7 and the eighth signal line g8 through via holes 83, respectively. The seventh signal line g7, the eighth signal line g8 and the ninth signal line d9, which are connected with each other, may form the first gate line 13, the second gate line 14 and the third gate line 17 as mentioned above. The via holes 83 may be arranged near the edges of the first wiring area 3 at both sides thereof in the column direction, for example, the via holes 83 may be arranged on the edges of the first wiring area 3 at both sides thereof in the column direction. The display panel of the present disclosure transfers the seventh signal line g7 and the eighth signal line g8 through the ninth signal line d9 located in the third conductive layer, thus avoiding the intersection of the gate line in the display panel with the third signal line or the sixth signal line in the first wiring area 3.

The exemplary embodiment also provides a display device including the display panel and a camera, and the camera is arranged directly facing the light-transmitting area of the display panel. The display device may be a mobile phone, a tablet computer, or the like.

Other embodiments of the disclosure will be apparent to those skilled in the art from consideration of the specification and practice of the disclosure disclosed herein. This application is intended to cover any variations, uses, or adaptations of the disclosure following, in general, the principles of the disclosure and including such departures from the present disclosure as come within known or customary practice in the art to which the disclosure pertains. It is intended that the specification and examples be considered as exemplary only, with a true scope and spirit of the disclosure being indicated by the following claims.

It will be understood that the present disclosure is not limited to the precise arrangements that have been described above and shown in the drawings, and may be modified and changed without departing from the scope thereof. The scope of the present disclosure is limited only by the appended claims.

What is claimed is:

1. A display panel comprising:
a light-transmitting area;
a first transitional display area located at both sides of the light-transmitting area in a row direction;
a first main display area located at a side of the light-transmitting area and the first transitional display area in a column direction;
a second main display area located at the other side of the light-transmitting area and the first transitional display area in the column direction;
a first light-emitting unit located in the light-transmitting area;
a first pixel driving circuit located in the first transitional display area for providing a driving current to the first light-emitting unit;
a first signal line extending along the column direction, and at least partially located in the first main display area, for providing a driving signal to a pixel driving circuit located in the same sub-pixel column as the first pixel driving circuit;
a second signal line extending along the column direction, and at least partially located in the second main display area, for providing a driving signal to the pixel driving circuit located in the same sub-pixel column as the first pixel driving circuit;
a third signal line, the third signal line and the first signal line being located in different conductive layers, the third signal line and the second signal line being located in different conductive layers, and the third signal line being respectively connected with the first signal line and the second signal line through via holes;
a first wiring area, located at a side of the first transitional display area away from the light-transmitting area;
a sixth signal line, located in the first wiring area; and
second wiring areas located at both sides of the light-transmitting area and the first transitional display area in the column direction, wherein the first wiring area and the second wiring areas form a rectangle surrounding around the first transitional display area and the light-transmitting area;
wherein the third signal line is also located in one of the second wiring areas, and extends to the one of the second wiring areas along the column direction and to the first wiring area along the row direction; and
the sixth signal line is also located in one of the second wiring areas, and extends to the one of the second wiring areas along the column direction and to the first wiring area along the row direction.

2. The display panel according to claim 1,
wherein the first main display area is also located at a side of the first wiring area in the column direction, and the second main display area is also located at the other side of the first wiring area in the column direction; and
the third signal line is at least partially located in the first wiring area.

3. The display panel according to claim 2, further comprising:
a second light-emitting unit located in the first wiring area;
a second pixel driving circuit located in the first transitional display area, for providing a driving current to the second light-emitting unit;
a fourth signal line extending along the column direction, and at least partially located in the first main display area, for providing a driving signal to a pixel driving circuit located in the same sub-pixel column as the second pixel driving circuit; and
a fifth signal line extending along the column direction, and at least partially located in the second main display area, for providing a driving signal to the pixel driving circuit located in the same sub-pixel column as the second pixel driving circuit;
wherein the sixth signal line is connected with the fourth signal line and the fifth signal line through via holes, respectively.

4. The display panel according to claim 3, wherein a plurality of third signal lines and a plurality of sixth signal lines are provided, and the plurality of third signal lines and the plurality of sixth signal lines form a plurality of transfer lines comprising a plurality of first transfer lines and a plurality of second transfer lines;
the display panel also comprises:
a base substrate;
a first conductive layer arranged at a side of the base substrate, at least a part of the first conductive layer is configured to form the first transfer line;

a second conductive layer arranged at a side of the first conductive layer away from the base substrate, and at least a part of the second conductive layer is configured to form the second transfer line;

a third conductive layer arranged at a side of the second conductive layer away from the base substrate, at least a part of the third conductive layer is configured to form the first signal line, the second signal line, the fourth signal line and the fifth signal line;

wherein an orthographic projection of the first transfer line on the base substrate and an orthographic projection of the second transfer line on the base substrate are sequentially alternately distributed in the vertical direction of an extending direction thereof.

5. The display panel according to claim 4, further comprising:

a seventh signal line extending along the row direction and located at a side of the first wiring area away from the light-transmitting area, the seventh signal line being formed by a part of the first conductive layer or a part of the second conductive layer;

an eighth signal line extending along the row direction and at least partially located in the first transitional display area, the eighth signal line being formed by a part of the first conductive layer or a part of the second conductive layer; and a ninth signal line extending along the row direction and located in the first wiring area, the ninth signal line is formed by a part of the third conductive layer, and is respectively connected with the seventh signal line and the eighth signal line through via holes.

6. The display panel according to claim 2, wherein the first main display area and the second main display area have the same pixel density, and the first wiring area, the first transitional display area and the light-transmitting area have the same pixel density;

the pixel density of the first main display area is larger than the pixel density of the light-transmitting area.

7. The display panel according to claim 1, wherein a plurality of first light-emitting units and a plurality of first pixel driving circuits are provided, the first pixel driving circuits and the first light-emitting units connected thereto are located in the same row, and each of the first pixel driving circuits is spaced apart from a first light-emitting unit connected thereto by the same sub-pixel column in the row direction.

8. The display panel according to claim 1, further comprising a second transitional display area arranged adjacent to a side of the second wiring area in the column direction, and further comprising:

a fifth light-emitting unit located in the second wiring area;

a fifth pixel driving circuit located in the second transitional display area, for providing a driving current to the fifth light-emitting unit.

9. The display panel according to claim 8, further comprising a sixth sub-pixel located in the second transitional display area, the sixth sub-pixel comprising:

a sixth light-emitting unit;

a sixth pixel driving circuit for providing a driving current to the sixth light-emitting unit;

the sixth pixel driving circuit and the fifth pixel driving circuit being located in different sub-pixel columns.

10. The display panel according to claim 9, wherein a plurality of fifth pixel driving circuits and a plurality of fifth light-emitting units are provided, and each of the fifth pixel driving circuits is spaced apart from a fifth light-emitting unit connected thereto by the same sub-pixel row in the column direction.

11. The display panel according to claim 8, wherein the first main display area and the second main display area have the same pixel density, and the first wiring area, the first transitional display area, the light-transmitting area, the second wiring area and the second transitional display area have the same pixel density;

the pixel density of the first main display area is larger than the pixel density of the light-transmitting area.

12. A display device, comprising:

a display panel; and a camera directly facing the light-transmitting area of the display panel;

wherein the display panel comprises:

a light-transmitting area;

a first transitional display area located at both sides of the light-transmitting area in a row direction;

a first main display area located at a side of the light-transmitting area and the first transitional display area in a column direction;

a second main display area located at the other side of the light-transmitting area and the first transitional display area in the column direction;

a first light-emitting unit located in the light-transmitting area;

a first pixel driving circuit located in the first transitional display area for providing a driving current to the first light-emitting unit;

a first signal line extending along the column direction, and at least partially located in the first main display area, for providing a driving signal to a pixel driving circuit located in the same sub-pixel column as the first pixel driving circuit;

a second signal line extending along the column direction, and at least partially located in the second main display area, for providing a driving signal to the pixel driving circuit located in the same sub-pixel column as the first pixel driving circuit;

a third signal line, the third signal line and the first signal line being located in different conductive layers, the third signal line and the second signal line being located in different conductive layers, and the third signal line being respectively connected with the first signal line and the second signal line through via holes;

a first wiring area, located at a side of the first transitional display area away from the light-transmitting area;

a sixth signal line, located in the first wiring area; and second wiring areas located at both sides of the light-transmitting area and the first transitional display area in the column direction, wherein the first wiring area and the second wiring areas form a rectangle surrounding around the first transitional display area and the light-transmitting area;

wherein the third signal line is also located in one of the second wiring areas, and extends to the one of the second wiring areas along the column direction and to the first wiring area along the row direction; and the sixth signal line is also located in one of the second wiring areas, and extends to the one of the second wiring areas along the column direction and to the first wiring area along the row direction.

13. The display device according to claim 12, wherein the first main display area is also located at a side of the first wiring area in the column direction, and the second main display area is also located at the other side of the first wiring area in the column direction; and the third signal line is at least partially located in the first wiring area.

14. The display device according to claim 13, wherein the display panel further comprises:
- a second light-emitting unit located in the first wiring area;
- a second pixel driving circuit located in the first transitional display area, for providing a driving current to the second light-emitting unit;
- a fourth signal line extending along the column direction, and at least partially located in the first main display area, for providing a driving signal to a pixel driving circuit located in the same sub-pixel column as the second pixel driving circuit; and
- a fifth signal line extending along the column direction, and at least partially located in the second main display area, for providing a driving signal to the pixel driving circuit located in the same sub-pixel column as the second pixel driving circuit;
- wherein the sixth signal line is connected with the fourth signal line and the fifth signal line through via holes, respectively.

15. The display device according to claim 12, wherein a plurality of first light-emitting units and a plurality of first pixel driving circuits are provided, the first pixel driving circuits and the first light-emitting units connected thereto are located in the same row, and each of the first pixel driving circuits is spaced apart from a first light-emitting unit connected thereto by the same sub-pixel column in the row direction.

* * * * *